United States Patent
Nunomiya et al.

[19]

[11] Patent Number: 6,023,175
[45] Date of Patent: Feb. 8, 2000

[54] LEVEL INTERFACE CIRCUIT

[75] Inventors: Kazuhiro Nunomiya; Toshiya Uchida; Hiroko Douchi, all of Kawasaki, Japan

[73] Assignee: Fujitsu Limited, Kawasaki, Japan

[21] Appl. No.: 09/016,329

[22] Filed: Jan. 30, 1998

[30] Foreign Application Priority Data

Sep. 4, 1997 [JP] Japan ................................ 9-239910

[51] Int. Cl.[7] .............................................. H03K 19/0185
[52] U.S. Cl. .............................. 326/68; 326/81; 327/407
[58] Field of Search .................................. 326/57, 58, 68, 326/70, 71, 80, 81, 49, 50; 327/407, 408

[56] References Cited

U.S. PATENT DOCUMENTS

| | | | |
|---|---|---|---|
| 5,019,729 | 5/1991 | Kimura et al. | 326/71 |
| 5,818,783 | 10/1998 | Kim | 365/226 |
| 5,880,601 | 3/1999 | Kanazawa et al. | 326/68 |
| 5,917,759 | 6/1999 | Akashi | 365/180.07 |

*Primary Examiner*—Michael Tokar
*Assistant Examiner*—Don Phu Le
*Attorney, Agent, or Firm*—Nikaido, Marmelstein, Murray & Oram LLP

[57] ABSTRACT

The present invention relates to a level interface circuit, which receives a first interface input signal having a level H and a level L, as fixed potentials, and a first reference level which is midway therebetween, and a second interface input signals having a level H, a level L and a second reference level determined in accordance with a power source voltage, and which compares an input signal of one of said first and second interface input with one of said first and second reference level signal and generates an output signal, said level interface circuit further comprising: a first and a second transistors, having a common source connection, for receiving said input signal and said reference level signal at respective gates; a current source transistor connected to said source of said first and said second transistors; a load circuit connected to drains of said first and said second transistors; a voltage control transistor provided between said load circuit and said power voltage source; and a voltage controller for determining whether said input signal corresponds to said first or said second interface input, and increasing or reducing an impedance of said power control transistor in accordance with the determination.

3 Claims, 8 Drawing Sheets

LEVEL INTERFACE CIRCUIT

BACKGROUND OF THE INVENTION

1. Field of the Invention

The present invention relates to a level interface circuit that can cope with different interface inputs standards and reference levels.

2. Related Arts

LVTTL (Low Voltage Transistor Transistor Logic) circuits have been widely employed as interfaces for dynamic RAM and other integrated circuit devices. A LVTTL circuit has a low TTL voltage level that requires a power voltage of 3.3 V, which is slightly lower than the TTL power voltage level of 5 V. According to its specifications, the voltage of a LVTTL must be 2.0 V or higher at level H, and 0.8 V or lower at level L, with the reference level Vref being fixed at a middle voltage of 1.4 V. Since the bus of a system is open ended, one failing of a LVTTL circuit is that the production of noise due to ringing is increased during a high-speed operation.

An SSTL (Series Stub Termination Logic) circuit has been proposed as an interface that is suitable for high-speed operation. According to the specifications for the use of the SSTL, the bus of a system is closed using a predetermined resistance to prevent the production of noise during a high-speed operation. For the SSTL circuit, the reference level Vref is around 0.45 times (0.43 to 0.47 times) the power voltage Vcc, and fluctuates in accordance with changes in the power voltage. The level H for a signal is set 0.2 V higher than the reference level Vref, and the level L is set 0.2 V lower than the reference level Vref.

Figure 8:
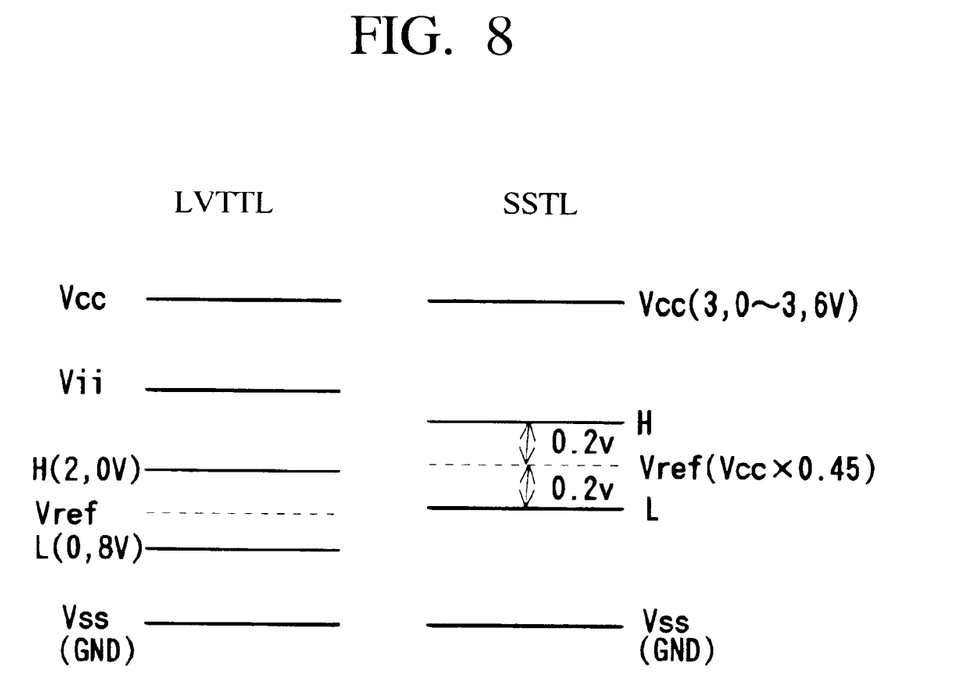
FIG. 8 is a diagram illustrating a diagram showing the relationship between the levels of the LVTTL and SSTL interface circuits.

FIG. 8 is a diagram showing the relationship between the levels of the LVTTL and SSTL interface circuits. For the LVTTL circuit, as is described above, the reference level Vref is set about 1.4 V higher than the ground Vss, regardless of the power voltage Vcc, and is ordinarily generated in an integrated circuit. For the SSTL circuit, the reference level Vref varies in accordance with changes in the power voltage Vcc, and is externally supplied to an integrated circuit. It should be noted that for the SSTL circuit the entire system bus is a platform whereat the reference level voltage Vref and the level of the signal vary as the power voltage Vcc fluctuates, and strongly resists changes in the power voltage.

Figure 7:
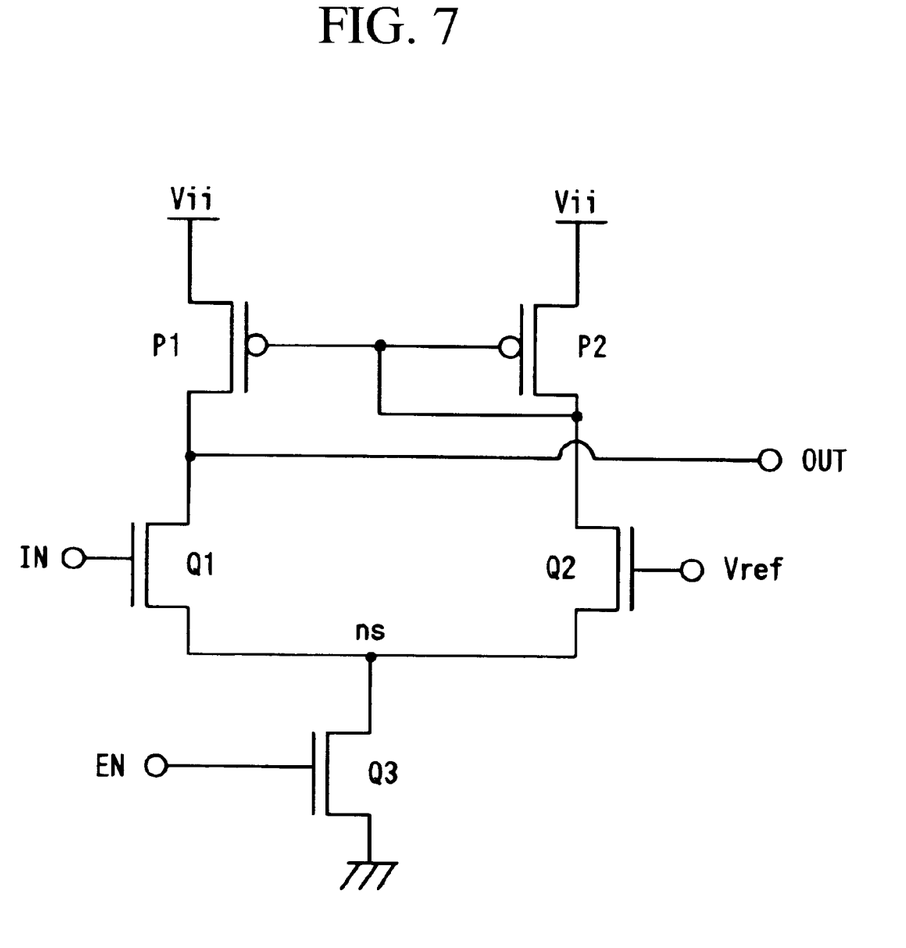
FIG. 7 is a diagram illustrating a level interface circuit according to a third embodiment of the present invention.

FIG. 7 is a diagram illustrating a conventional level interface circuit. This circuit includes N type transistors Q1 and Q2, to which input signal IN and reference voltage level Vref are supplied at their respective gates; a current source transistor Q3, which is provided between a common source terminal ns and a ground Vss and is controlled by an enable signal EN; and a load circuit having P type transistors P1 and P2, which are located between the drains of the transistors Q1 and Q2 and an internal power source Vii. The load circuit is a current mirror circuit for adjusting the current values on either side to values proportional to the areas of the transistors P1 and P2. The internal power voltage Vii is a low voltage generated by the power source Vcc, and has a fixed potential which is not affected by changes in the power voltage Vcc. The output terminal OUT is connected to the drain of the transistor Q1, and is transmitted to a CMOS circuit (not shown) at the following stage.

The level interface circuit compares externally input signal IN with the reference level voltage Vref, and in accordance with level H and level L of the input IN, generates at the output terminal OUT a signal whose level is adjusted to the level of a CMOS circuit at the following stage.

When the above described level interface circuit is designed while adjusting it to a LVTTL circuit, for example, a satisfactory operating margin can not be provided for the input signal IN and the reference level voltage Vref of the SSTL.

Assume that the power voltage Vii is supplied to the sources of the P type transistors P1 and P2, as is shown in FIG. 7. When the reference level voltage Vref and the input signal IN corresponding to the LVTTL circuit are supplied to the gates of the transistors Q1 and Q2, a normal operation is performed. But in case that the reference level voltage Vref and the input signal IN corresponding to the SSTL circuit are supplied to the gates of the transistors Q1 and Q2, when both the reference level voltage Vref (=Vcc×0.45) and the input signal IN rise as the power voltage Vcc is increased, as a result, the gate voltage goes too high relative to the common source node ns, and the transistors Q1 and Q2 may be rendered active in the saturated area. Thus, a signal at the out signal OUT does not have a sufficient amplitude, and a normal differential circuit operation is impossible. Where the power voltage Vcc falls, and accordingly, the reference level voltage Vref (=Vcc×0.45) and the input signal IN are dropped, the gate voltage goes too low relative to the common source node ns, and the transistors Q1 and Q2 may be rendered to be a less conductive area. In this case, a signal having an appropriate amplitude can not be generated at the output terminal OUT.

As is described above, it is difficult for the above described differential circuit to be applied under both a LVTTL interface, which does not depend on a power voltage, and an SSTL interface, which has a level which depends on a power voltage.

SUMMARY OF THE INVENTION

It is, therefore, one object of the present invention to provide a level interface circuit which can comply with different interface signals.

It is another object of the present invention to provide a level interface circuit which can handle both an interface having a fixed potential level and an interface having a level which depends on a power voltage.

To achieve the above objects, according to a first aspect of the present invention, provided is a level interface circuit, which receives first interface input having a level H and a level L, as fixed potentials, and a first reference level which is midway in between, or a second interface input having a level H, a level L and a second reference level determined in accordance with a power source voltage, and which compares an input signal of one of said first and second interface input with one of said first and second reference level and generates an output signal, said level interface circuit comprising:

a first interface circuit including a first and a second transistors, having a common source connection, for receiving said input signal and said first reference level signal at respective gates, a first current source transistor connected to said source of said first and said second transistors, and a first load circuit provided between drains of said first and said second transistors and a fixed internal voltage source lower than said power source voltage;

a second interface circuit including a third and a fourth transistors, having a common source connection, for receiving said input signal and said second reference level signal at respective gates, a second current source transistor connected to said source of said third and said fourth transistors, and a second load circuit provided between drains of said third and said fourth transistors and said power source voltage; and a selector for determining whether said input signal corresponds to said first interface input or said second interface input and for rendering said first or said second current source transistor active in accordance with the determination.

Since the first interface circuit has an optimal arrangement for the LVTTL interface circuit, and the second interface circuit has an optimal arrangement for the SSTL interface circuit, the appropriate level interface functions can be provided.

To achieve the above objects, according to a second aspect of the present invention, provided is a level interface circuit, which receives a first interface input having a level H and a level L, as fixed potentials, and a first reference level which is midway therebetween, or a second interface input having a level H, a level L and a second reference level determined in accordance with a power source voltage, and which compares an input signal of one of said first and second interface input with one of said first and second reference level signal and generates an output signal, said level interface circuit further comprising:

a first and a second transistors, having a common source connection, for receiving said input signal and said reference level signal at respective gates;

a current source transistor connected to said source of said first and said second transistors;

a load circuit connected to drains of said first and said second transistors;

a voltage control transistor provided between said load circuit and said power source voltage; and a voltage controller for determining whether said input signal corresponds to said first or said second interface, and increasing or reducing an impedance of said power control transistor in accordance with the determination.

In this aspect, for the LVTT circuit, a voltage applied to the load circuit equals the potential of the internal power source, and for the SSTL circuit, a voltage applied to the load circuit equals the potential of the external power source. Therefore, substantially the same circuit as in the first aspect can be provided.

To achieve the above objects, according to a third aspect of the present invention, provided is a level interface circuit, which receives a first interface input having a level H and a level L as fixed potentials, and a first reference level signal which is middle therebetween, or a second interface input having a level H, a level L and a second reference level determined in accordance with a power source voltage, and which compares an input signal of one of said first and second interface input with one of said first and second reference level signal and generates an output signal, said level interface circuit further comprising:

a first and a second transistors, having a commonly connected source, for receiving said input signal and said reference level signal at respective gates;

a current source transistor connected to said source of said first and said second transistors;

a load circuit located between drains of said first and said second transistors and said power source voltage; and a selector for determining whether said input signal corresponds to said first or said second interface, and increasing or reducing an impedance of said current source transistor in accordance with the determination.

For the LVTTL circuit, the common source node of the first and the second transistors has a lower voltage, while for the SSTL the common source node has a higher voltage, and the optimal operational range of the first and the second transistors can be maintained relative to their respective reference levels Vref.

DETAILED DESCRIPTION OF THE PREFERRED EMBODIMENTS

The preferred embodiments of the present invention will now be described while referring to the accompanying drawings. The technical scope of the present invention is, however, not limited to these embodiments.

[First Embodiment]

Figure 1:
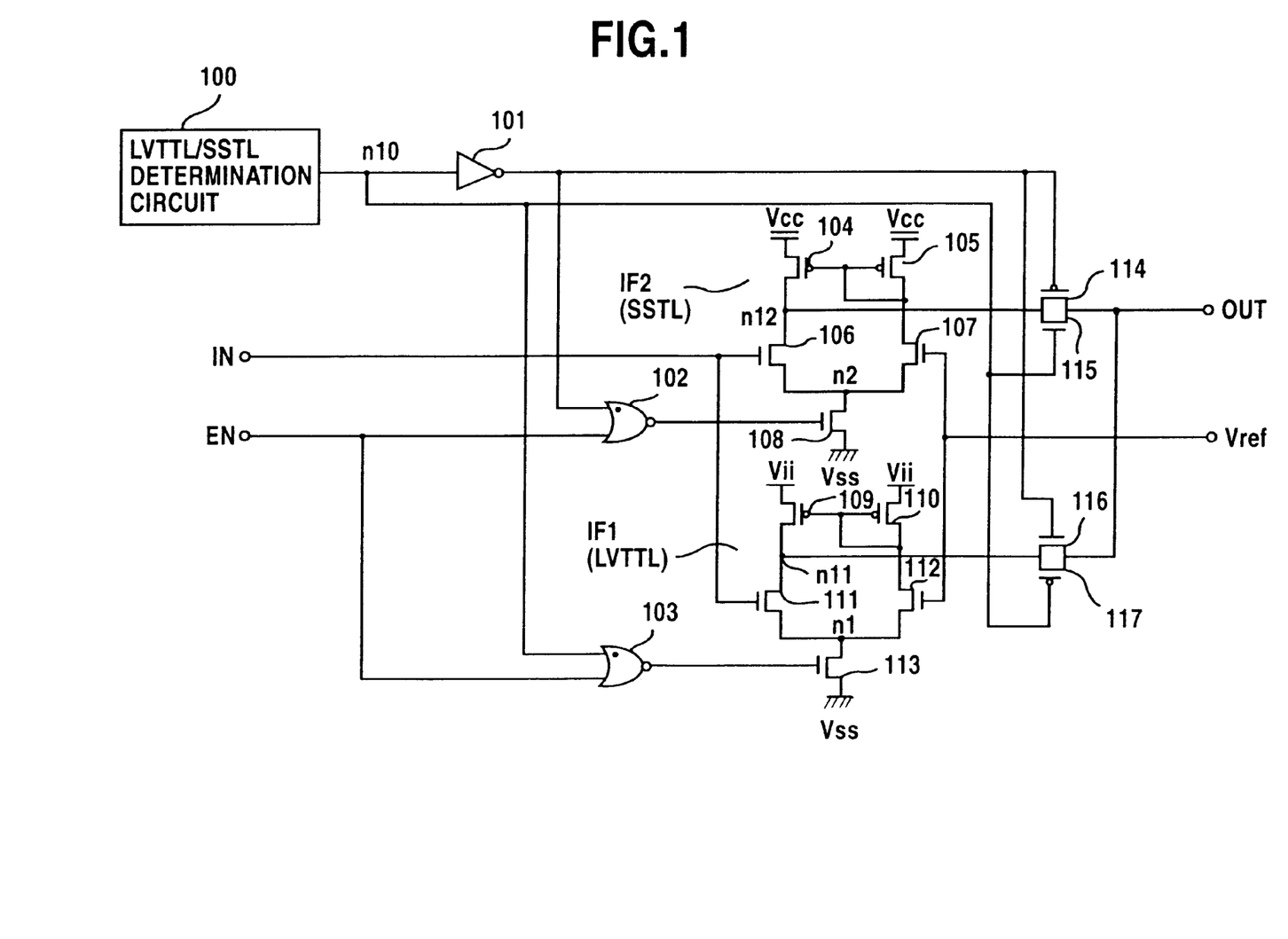
FIG. 1 is a diagram illustrating a level interface circuit according to a first embodiment of the present invention.

FIG. 1 is a diagram illustrating a level interface circuit according to a first embodiment of the present invention. The level interface circuit comprises: a first interface circuit IF1, to handle an LVTTL circuit input signal IN and a reference level voltage Vref; a second interface circuit IF2, to handle an SSTL circuit input signal IN and a reference level voltage Vref; a determination circuit 100 for detecting an externally received reference level voltage Vref and determining whether or not it is an LVTTL circuit signal or an STTL circuit signal; and a selector, which includes an inverter 101 and NOR gates 102 and 103 for rendering one of the interface circuits IF1 or IF2 active in accordance with output signal n10 of the determination circuit 100. An enable signal EN is transmitted to the NOR gates 102 and 103.

In the first interface circuit IF1 for handling the LVTTL circuit input signal IN and the reference level voltage Vref, an N type transistor 111 for receiving the input signal IN at its gate, and an N type transistor 112 for receiving the reference level voltage Vref at its gate, are connected to a common source n1, and a current source transistor 113 is provided between the source terminal n1 and the ground Vss. A load circuit consisting of P type transistors 109 and 110, as in the conventional case, is located between the drains of the transistors 111 and 112, with common source, and an internal power source Vii. The load circuit functions as a current mirror. A drain terminal n11 of the transistor 111 is connected to an output terminal OUT via transfer gates 116 and 117.

In the second interface circuit IF2, corresponding to the SSTL circuit input signal IN and the reference level voltage Vref, an N type transistor 106 for receiving the input signal IN at its gate, and an N type transistor 107 for receiving the reference level voltage Vref at its gate, are connected to a common source, and a current source transistor 108 is provided between the source terminal n2 and the ground Vss. A load circuit consisting of P type transistors 104 and 105, as in the conventional case, is located between the drains of the transistors 106 and 107 with common sources, and an internal power source Vcc. The load circuit functions as a current mirror. A drain terminal n12 of the transistor 106 is connected to an output terminal OUT via transfer gates 114 and 115.

The LVTTL/SSTL determination circuit 100 examines the externally received reference level voltage Vref, and generates output signal n10 at level L for VTTL and output signal n10 at level H for SSTL. When LVTTL is detected, the output signal at the NOR gate 103 goes to level H because of the level L of the output signal n10 and the active level L of the input enable signal EN; the transistor 113 is rendered conductive; and the LVTTL interface circuit IF1 is activated. When SSTL is detected, the output signal at the NOR gate 102 goes to level H because of the level H of the output signal n10 and the active level L of the input enable signal EN; the transistor 108 is rendered conductive; and the SSTL interface circuit IF2 is activated.

In the first interface circuit IF1, a fixed internal power voltage Vii, which is not affected by changes in the external power voltage Vcc, is applied to the sources of the P type transistors 109 and 110 in the load circuit. As a result, since the impedance ratios of the transistors 109 and 110 and the current source transistor 113 are so set that the level of the common source node n1 is optimized for the level of the input IN and the reference level Vref for the LVTTL, thereby the operating margin for the circuit can be optimized. More specifically, since the internal power voltage Vii, which is not affected by changes in the power voltage Vcc, is employed relative to the input signal IN and reference level voltage Vref, which are also not affected by changes in the power voltage Vcc, the source node n1 of the transistors 111 and 112 that constitute a differential circuit can be a fixed potential, the voltage between the sources and the gates of the transistors 11 and 112 can be optimized, and the optimal operating region for the transistors can be maintained. Furthermore, since the internal power voltage Vii is the fixed potential, compared with when the external power voltage Vcc is employed, the level H and level L of the drain node n11 of the transistor 111 can be adjusted to the level of an internal CMOS circuit at the following stage.

When the external power source Vcc is connected to the first interface circuit IF1, the level of the drain node n11 of the transistor 111 varies in accordance with changes in the external power source Vcc, and its output does not match the threshold value of the CMOS circuit at the following stage. This is not a preferable phenomenon.

In the second interface circuit IF2, an external power voltage Vcc is applied to the sources of the P type transistors 104 and 105 in the load circuit. In the specifications, the external power voltage Vcc is permitted to vary, for example, between 3.0 V and 3.6 V. When the external power voltage Vcc rises, the impedances at the transistors 104 and 105 in the load circuit are reduced and the potential at the source node n2 is increased. Since the reference level voltage Vref generated by the external power source Vcc and the level of the input signal IN also rise, the gate-source voltage of the transistors 106 and 107, which are differentially operated, is little affected by the change in the power voltage, and is maintained in the optimal operating area. As a result, a signal having an amplitude which matches the threshold value of the CMOS circuit at the succeeding stage, is generated at the drain node n12 of the transistor 106.

When the external power voltage Vcc drops, on the other hand, the potential at the transistors 104 and 105 in the load circuit are increased and the potential at the source node n2 is reduced. Since the reference level Vref generated by the external power source Vcc and the level of the input signal IN are also reduced, the gate-source voltage of the transistors 106 and 107, which are differentially operated, is little affected by changes in the power voltage, and is maintained in the optimal operating area. As a result, a signal having an amplitude which matches the threshold value of the CMOS circuit at the succeeding stage is generated at the drain node n12 of the transistor 106. That is, a characteristic of the second interface circuit IF2 is that it is little affected by fluctuations in the external power voltage Vcc. The saturation or the cutoff of the transistors 106 and 107 due to changes in the external power voltage Vcc, which was described during the course of the explanation given for the prior art, can be prevented.

Figure 2:
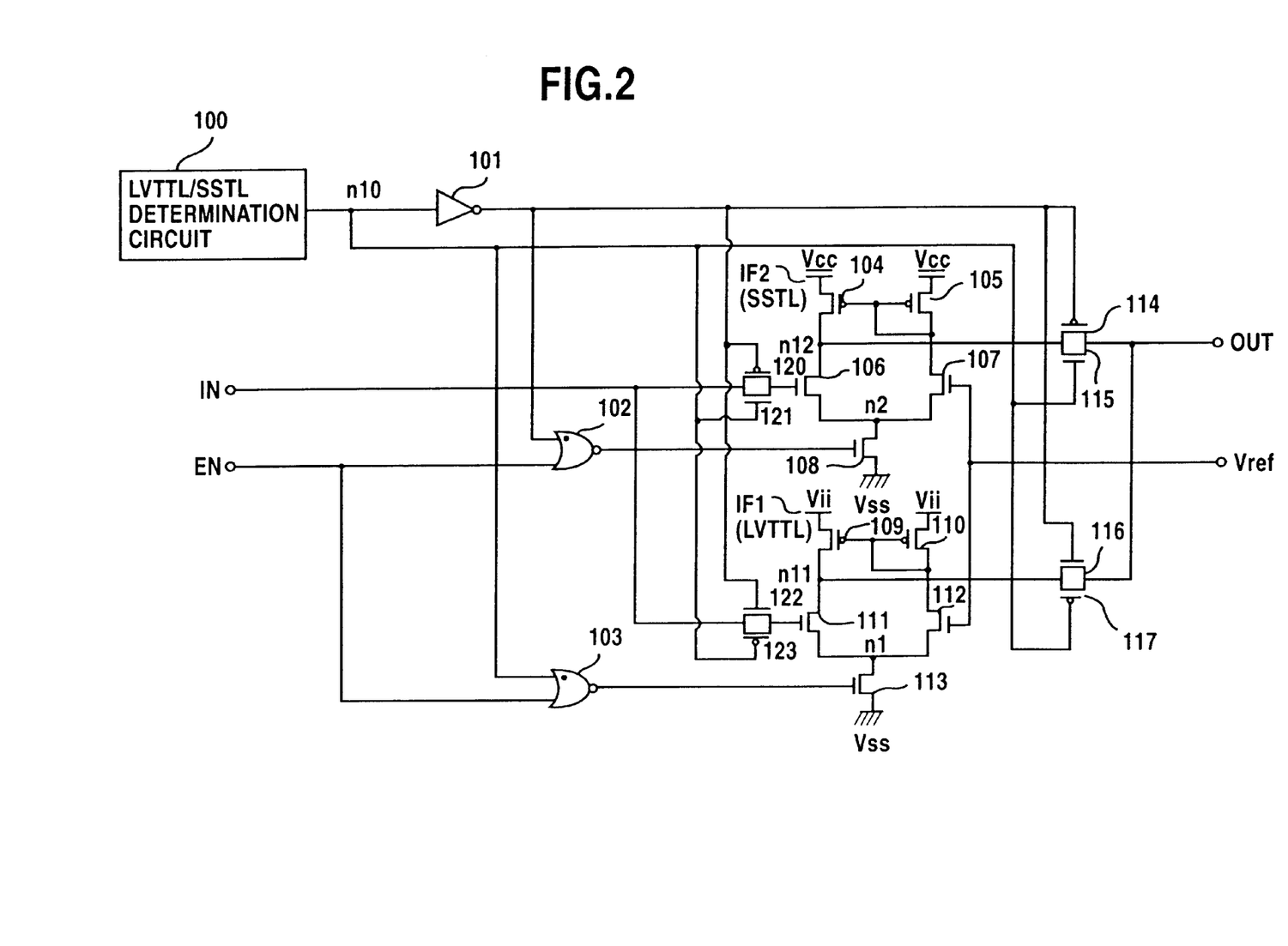
FIG. 2 is a diagram illustrating a modification of the first embodiment in FIG. 1.

FIG. 2 is a diagram illustrating a modification of the first embodiment in FIG. 1. The same reference numerals as are used in FIG. 1 are also used to denote corresponding or identical components. In this modification, CMOS transfer gates 120, 121, 122 and 123 are provided between an input terminal IN and the gates of transistors 106 and 111 in the interface circuit, and are controlled by an output signal n10 from an LVTTL/SSTL determination circuit 100 and its inverted signal.

When the determination circuit 100 detects LVTTL and sets the output node n10 to level L, the output of an inverter 101 goes to level H, the N type transistor 122 and the P type transistor 123 are rendered conductive, and the input signal IN is transmitted to the gate of the transistor 111 of the first interface circuit IF1. Since, at this time, the transfer gate constituted by the transistors 120 and 121 is rendered inactive, the gate capacitance of the input terminal IN is reduced by the equivalent of the gate capacitance of the transistor 106. As the junction capacity of the transfer gate is smaller than the gate capacity, in the modification in FIG. 2, the capacitance connected to the input terminal IN is smaller than that in the embodiment in FIG. 1. The transfer gates 116 and 117 are also rendered conductive in response to the output from the determination circuit 100, and the drain node n11 of the transistor 111 is connected to the output terminal OUT.

When the determination circuit 100 detects SSTL and sets the output node n10 to level H, the transfer gates 120 and 121 are rendered conductive, and the input terminal IN is connected to the gate of the transistor 106 of the second interface circuit IF2, while the gate of the transistor 111 of the first interface circuit IF1 is disconnected. The transfer gates 114 and 115 are also rendered conductive in response to the output from the determination circuit 100, and the drain node n12 of the transistor 106 is connected to the output terminal OUT.

[Second Embodiment]

Figure 3:
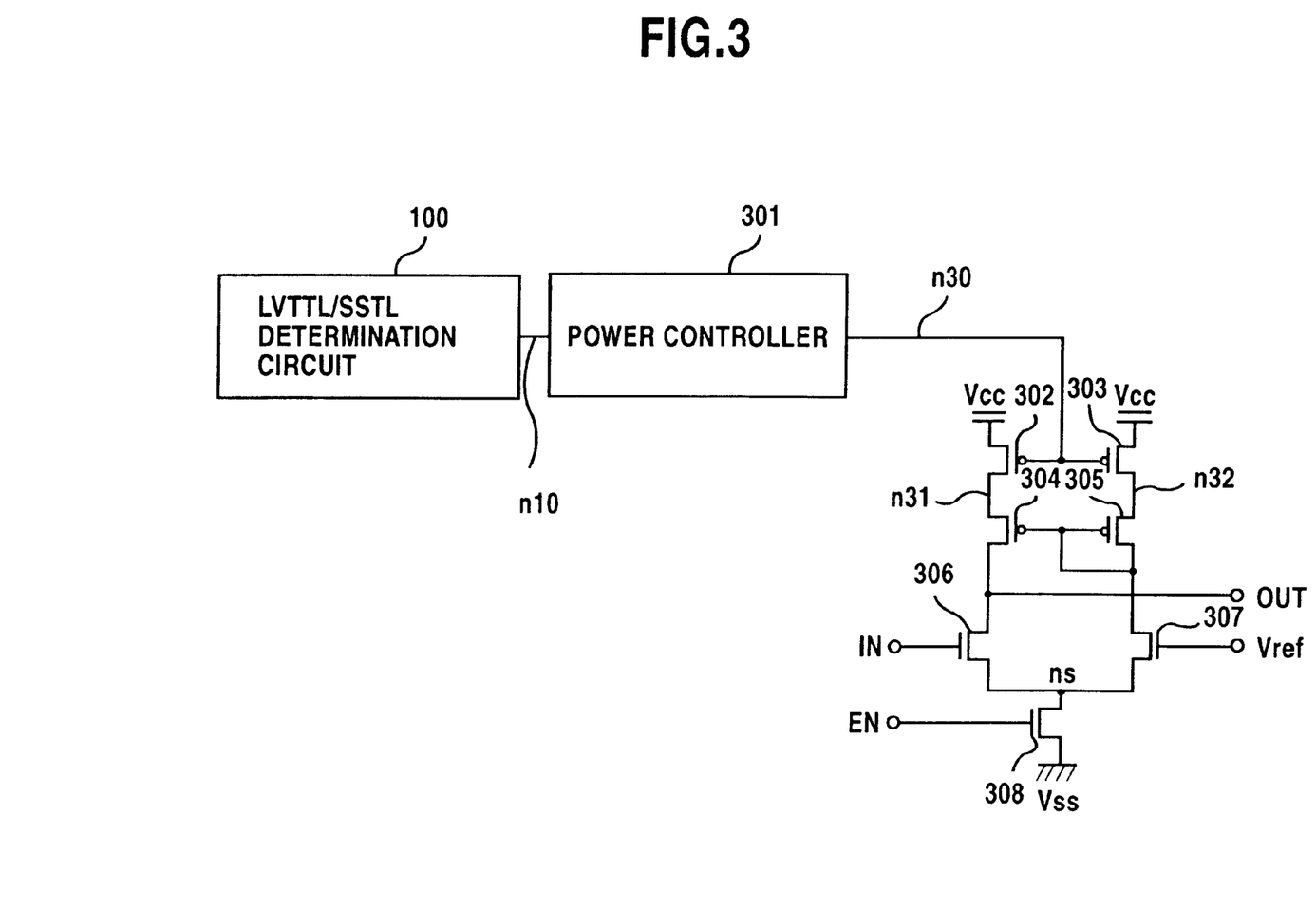
FIG. 3 is a diagram illustrating a level interface circuit according to a second embodiment of the present invention.

FIG. 3 is a diagram illustrating a level interface circuit according to a second embodiment of the present invention. In this embodiment, a transistor 306, to the gate of which an input signal IN is supplied, and a transistor 307, to the gate of which a reference level voltage Vref is supplied, are connected together at a common source, and a current source transistor 308, to which an input enable signal EN is supplied, is provided between the source node ns and the ground Vss. Further, a load circuit constituted by P type transistors 304 and 305 is connected to the drains of the transistors 306 and 307. The above arrangement is the same as that for the prior art.

In addition, in the second embodiment, P type transistors 302 and 303 are provided between source nodes n31 and n32 of the transistors 304 and 305 in the load circuit to control voltages at the source nodes n31 and n32. The gates of the transistors 302 and 303 are controlled in response to the receipt of an output signal n30 from a power controller 301. Furthermore, the power controller 301 is controlled in response to an output signal n10 from an LVTTL/SSTL determination circuit 100.

Assuming that from an examination of the reference level voltage Vref the determination circuit 100 determines that the logic is LVTTL, the output voltage n30 from the power controller 301 is adjusted to a level so that the P type transistors 302 and 303 are not in complete conductive range. Specifically, the level of the output voltage n30 is adjusted to a level lower than the external power voltage Vcc substantially by the amount equivalent to the threshold value voltage Vth. As a result, the transistors 302 and 303 are rendered conductive, while having a high impedance, and the nodes n31 and n32 are adjusted to a potential lower than the external power voltage Vcc. Therefore, when a fixed potential, which does not depend on changes in the external voltage Vcc, is applied to the input terminal IN and the reference level voltage Vref, an influence imposed on the output signal OUT due to the fluctuation of the external power voltage Vcc can be limited.

Assuming that from the reference level voltage Vref the determination circuit 100 determines that the logic is the SSTL, the output voltage n30 from the power controller 301 is adjusted to a level at which the P type transistors 302 and 303 are completely conductive. Specifically, the level of the output voltage n30 is adjusted to a level very much lower than the external power voltage Vcc by the amount greater than the threshold value voltage Vth. As a result, the impedances at the transistors 302 and 303 are reduced, and the potentials at the nodes n31 and n32 are controlled to be the potential equal to the external power voltage Vcc. Therefore, a change in the external voltage Vcc is transmitted to the nodes n31 and n32.

Since for the SSTL the level at the input IN and the reference level voltage Vref are determined from the external power voltage Vcc, even when they are varied in the same manner as a consequence of the fluctuation of the external power voltage Vcc, the operating range of the transistors 306 and 307 is not greatly changed. This operation is completely the same as is that for the second interface circuit IF2 in FIG. 1.

Figure 4:
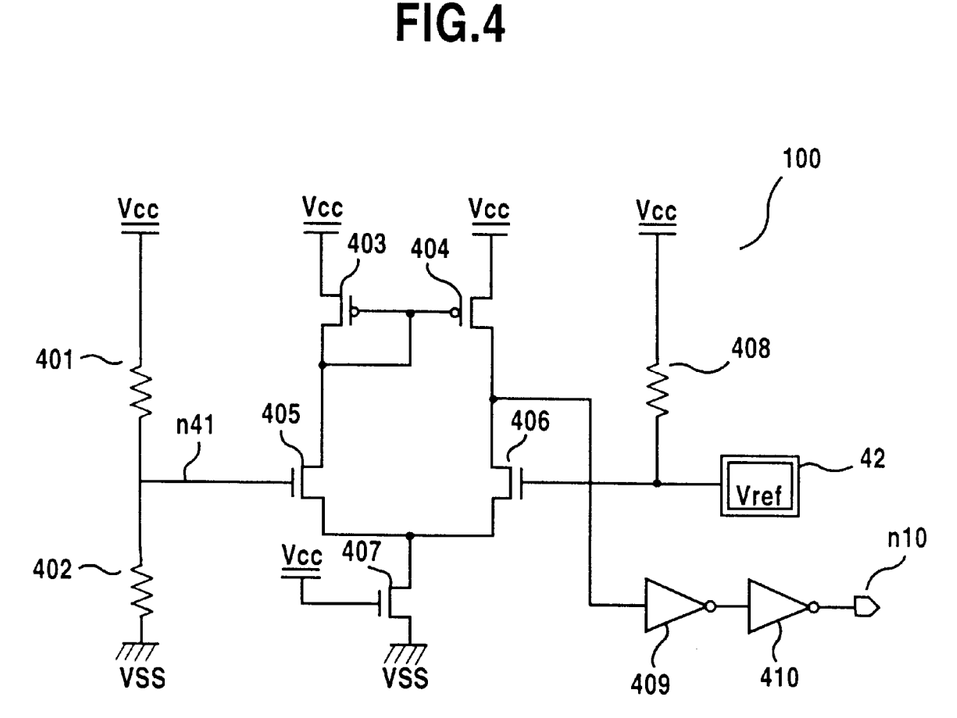
FIG. 4 is a diagram illustrating an example of the determination circuit for both interface circuits.

FIG. 4 is a diagram illustrating an example of the determination circuit for both interface circuits. The determination circuit compares the level of a signal supplied to a reference level terminal 42 in an integrated circuit with a level at a node n41, which is divided by resistors 401 and 402, to determine whether the interface is an LVTTL circuit or an SSTL circuit. When the interface is the LVTTL, the external power voltage Vcc is supplied to the reference level terminal 42, or the reference level terminal 42 enters a floating state. When the interface is the SSTL circuit, the reference level voltage Vref is supplied externally to the reference level terminal 42. The reference level voltage Vref has a potential of 45% of the external power voltage Vcc. Thus, when the potential at the node n41 is so set that it lies between the reference level voltage Vref, which is to be supplied for the SSTL interface, and the external power voltage Vcc, the potential to be applied to the terminal 42 can be detected by the differential circuit constituted by transistors 405 and 406.

The external power voltage vcc is applied to the gate of the current source transistor 407, which is in the conductive state. Transistors 403 and 404 constitute a load circuit, which serves as a current circuit. Output n10 is transmitted from the drain terminal of the transistor 406 via inverter 409 and 410.

Assuming the interface is the LVTTL circuit, the reference level terminal 42 is at a level equal to the power voltage Vcc or is in the floating state, so that the potential at the gate of the transistor 406 becomes higher than the reference potential at the node n41 because of the use of a pull-up resistor 408. Thus, the level of the drain at the transistor 406 goes to level L and the output signal n10 also goes to level L.

Assuming the interface is the SSTL circuit, the reference level Vref is applied to the reference level terminal 42, so that the potential at the gate of the transistor 406 is lower than the potential at the node n41. The level at the drain of the transistor 406 goes to level H and the output signal n10 also goes to level H.

Therefore, the determination circuit 100 sets the output signal n10 to level L for the LVTTL circuit interface, and to level H for the SSTL circuit interface.

Figure 5:
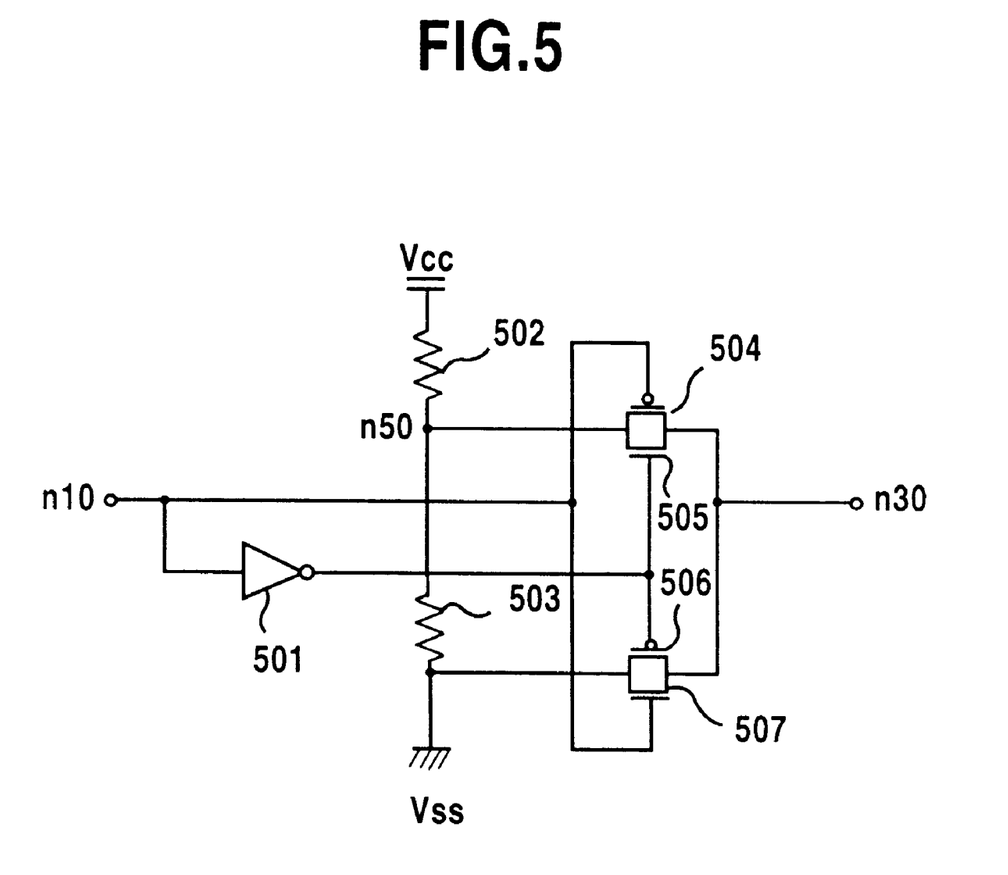
FIG. 5 is a diagram illustrating an example of the controller.

FIG. 5 is a diagram illustrating an example of the power controller 301. In this circuit, in response to the output signal n10 from the determination circuit 100, a potential, which is generated at a node n50 by resistance division performed by resistors 502 and 503, or the ground voltage Vss is supplied to the output n30. That is, when the determination circuit 100 detects the LVTTL interface and sets the output signal n10 to level L, transfer gates 504 and 505 are rendered conductive and the potential at the node n50 is transmitted to the output node n30. When the determination circuit 100 detects the SSTL interface and sets the output node signal n10 to level H, the transfer gates 506 and 507 are rendered conductive and the ground potential Vss is transmitted to the output node n30.

Referring again to FIG. 3, when the level at the output node n30 is the middle of the level at the node n50, the P type transistors 302 and 303 are placed in the conductive state with high impedances, and the nodes n31 and n32 are adjusted so that they have a lower potential than the external power voltage Vcc. Furthermore, since the potential at the node n50 varies in accordance with changes in the power voltage Vcc, the potentials at the nodes n31 and n32 are set at the same fixed level as is the internal power voltage Vii. When the potential at the output node n30 is the ground potential Vss, the P type transistors 302 and 303 are set in a conductive state with low impedance, and the potentials of nodes n31 and n32 are equal to the same potential as the external power voltage Vcc.

[Third Embodiment]

Figure 6:
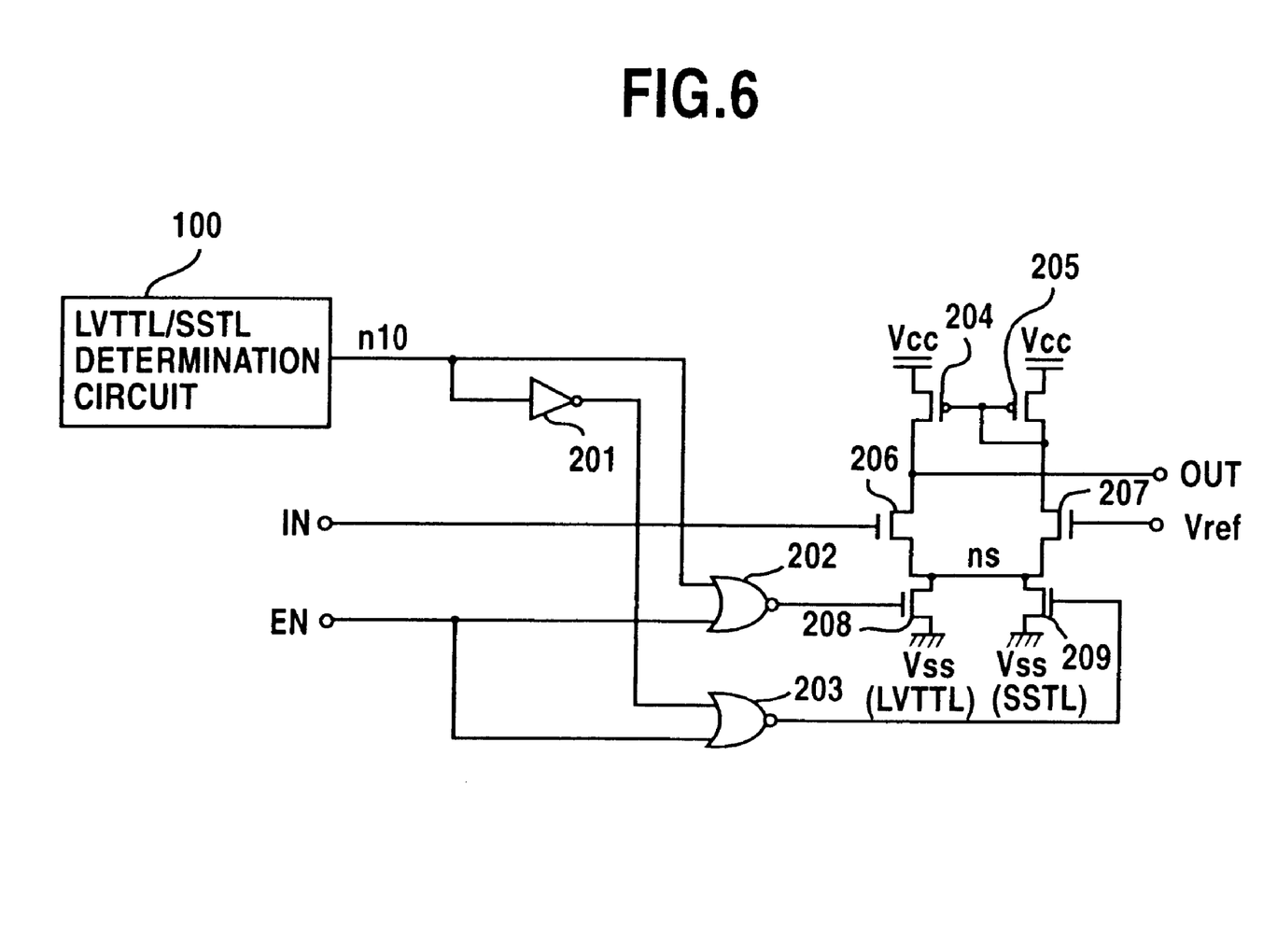
FIG. 6 is a diagram illustrating a level interface circuit according to a third embodiment.

FIG. 6 is a diagram illustrating a level interface circuit according to a third embodiment. In this embodiment, a transistor 206, to the gate of which an input signal IN is supplied, and a transistor 207, to the gate of which a reference level voltage Vref is supplied, are connected together at a common source, and a LVTTL current source transistor 208, and an SSTL current source transistor 209 are connected to a source node ns. Further, a load circuit constituted by P type transistors 204 and 205 is connected to the drains of the transistors 206 and 207 and the external power source Vcc. This load circuit serves as a current circuit.

In this embodiment, the current source transistors 208 and 209 are controlled by the output signal n10 from an LVTTL/SSTL determination circuit 100. When a LVTTL interface is detected, the output signal n10 goes to level L, and when an input enable signal EN is active, i.e., at level L, the transistor 208 is rendered conductive via an NOR gate 202. When an SSTL interface is detected, the output signal n10 goes to level H, and when an input enable signal EN is active, i.e., at level L, the transistor 209 is rendered conductive via an NOR gate 203.

If is so designed that the impedance at the LVTTL current source transistor 208 in the conductive state is lower than the impedance at the SSTL current source transistor 209 in the conductive state. As a result, when the LVTTL current source transistor 208 is rendered conductive, the potential at the source node ns is lower than when the SSTL current source transistor 209 is rendered conductive. Since the potential at the source node ns is controlled as above, operations of the differential transistors 206 and 207 that are appropriate for their impedances are ensured.

Specifically, according to the interface specifications, the reference level voltage Vref for the LVTTL interface is fixed of 1.4 V, as was previously described. However, the reference level voltage Vref for the SSTL interface is specified as being 0.43 to 0.47 times the external power voltage Vcc, which is permitted to range from 3.0 to 3.6 V, and therefore, the reference level voltage Vref for the SSTL interface is 1.7 V at the maximum and 1.3 V at the minimum. As a result, normally, the reference level voltage Vref (1.7 to 1.3 V) for SSTL is higher than the reference level voltage Vref (1.4 V) for LVTTL.

In the third embodiment, for LVTTL, the transistor 208 is rendered conductive and serves as a current source transistor having a low impedance, and the potential at the source node ns is set low. For SSTL, the transistor 209 is rendered conductive and serves as a current source transistor having a high impedance, and the potential at the source node ns is set high. As a result, the differences between the reference level voltages Vref for the differential transistors 206 and 207 and the voltage at the source node ns varies very little, regardless of the difference of their reference level voltages Vref. As a result, an appropriate operating margin for the level interface circuit can be obtained.

As is explained above, according to the present invention, provided is a level interface circuit that can be operated while maintaining an appropriate operational margin, complying to input signals and reference level voltages Vref for different interfaces. Since the level interface circuit of the present invention maintains the appropriate operational margin for both LVTTL interface and SSTL, the operation speed of the interface circuit can be higher than conventional circuit like FIG. 7.

What is claimed is:

1. A level interface circuit, which receives first interface input having a level H and a level L, as fixed potentials, and a first reference level which is midway inbetween, or a second interface input having a level H, a level L and a second reference level determined in accordance with a power source voltage, and which compares an input signal of one of said first and second interface input with one of said first and second reference level and generates an output signal, said level interface circuit comprising:

a first interface circuit including a first and a second transistors, having a common source connection, for receiving said input signal and said first reference level signal at respective gates, a first current source transistor connected to said source of said first and said second transistors, and a first load circuit provided between drains of said first and said second transistors and a fixed internal voltage source lower than said power source voltage;

a second interface circuit including a third and a fourth transistors, having a common source connection, for receiving said input signal and said second reference level signal at respective gates, a second current source transistor connected to said source of said third and said fourth transistors, and a second load circuit provided between drains of said third and said fourth transistors and said power source voltage; and a selector for determining whether said input signal corresponds to said first interface input or said second interface input and for rendering said first or said second current source transistor active in accordance with the determination.

2. A level interface circuit according to claim 1, further comprising a switch circuit for, in accordance with a determination of said selector, connecting said drain of said first or said second transistor, or said drain of said third or fourth transistor, to an output terminal to which an output signal is supplied.

3. A level interface circuit according to claim 1, further comprising a switch circuit for, in accordance with a determination by said selector, connecting said gate of said first or said third transistor to an input terminal to which said input signal is supplied.

* * * * *

UNITED STATES PATENT AND TRADEMARK OFFICE
CERTIFICATE OF CORRECTION

PATENT NO.         : 6,023,175
APPLICATION NO. : 09/016329
DATED                 : February 8, 2000
INVENTOR(S)       : Kazuhiro Ninomiya et al.

It is certified that error appears in the above-identified patent and that said Letters Patent is hereby corrected as shown below:

Item [75] change "Nunomiya" to --Ninomiya--.

Signed and Sealed this

Twenty-fifth Day of March, 2008

JON W. DUDAS
*Director of the United States Patent and Trademark Office*